United States Patent
Brown et al.

(10) Patent No.: US 8,836,066 B1
(45) Date of Patent: Sep. 16, 2014

(54) AVALANCHE PHOTODIODE CONFIGURED FOR AN IMAGE SENSOR

(75) Inventors: Robert G. Brown, Tustin, CA (US); Steven E. Koenck, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 376 days.

(21) Appl. No.: 13/243,564

(22) Filed: Sep. 23, 2011

(51) Int. Cl.
*H01L 31/107* (2006.01)

(52) U.S. Cl.
USPC .......... 257/438; 257/292; 257/481; 257/603; 257/611

(58) Field of Classification Search
USPC .......... 257/290–293, 438, 481, 603, 607, 611
See application file for complete search history.

(56) References Cited

U.S. PATENT DOCUMENTS

2012/0267681 A1* 10/2012 Nemoto et al. ............... 257/139
2013/0099091 A1* 4/2013 Nemirovsky et al. ......... 250/206

OTHER PUBLICATIONS

McIntyre, R.J., The Distribution of Gains in Uniformly Multiplying Avalanche Photodiodes: Theory, IEEE Transactions on Electron Devices, vol. 19, No. 6, Jun. 1972, pp. 703-713.
McIntyre, R.J., Recent Developments in Silicon Avalanche Photodiodes, Measurement, vol. 3, No. 4, Oct.-Dec. 1985, pp. 146-152.

* cited by examiner

*Primary Examiner* — Matthew E Warren
(74) *Attorney, Agent, or Firm* — Donna P. Suchy; Daniel M. Barbieri

(57) ABSTRACT

An avalanche photodiode includes silicon crystal doped with impurities, where the doping profile of the silicon crystal includes a smoothly arcing donor-acceptor concentration curve decreasing with respect to distance into the interior of the silicon crystal that is interrupted by a narrower peak of increased concentration in the interior of the silicon crystal prior to further decreasing with respect to distance along the smoothly arcing donor-acceptor concentration curve.

5 Claims, 3 Drawing Sheets

AVALANCHE PHOTODIODE CONFIGURED FOR AN IMAGE SENSOR

BACKGROUND

The present disclosure relates to an avalanche photodiode configured for use as part of an image sensor, such as a charge-coupled device (CCD) image sensor or a complementary metal-oxide-semiconductor (CMOS) image sensor. The present disclosure further relates to use of low-doping profiles in reach-through avalanche photodiodes for reduction of the ionization ratio, k, such as to values of less than 0.02.

Photodiodes, in general, convert light to electricity. In some cases, light reaches and excites a p-n junction, which then generates voltage or current. Typically photodiodes are used in image sensors, such as active-pixel sensors that include an array of pixels containing photodiodes and amplifiers. Some photodiodes may be integrated into a charge-coupled device (CCD) image sensor to receive light photons and to indicate sensed pixels by producing electrical output. Other photodiodes are integrated in complementary metal-oxide-semiconductor (CMOS) image sensors.

CMOS and CCD image sensors may be used in night-vision goggles and other night-vision equipment. CMOS and CCD image sensors are generally preferred relative to other sensor technologies due to low cost. However, it is Applicant's understanding that the best commercially-available sensitivity for CMOS and CCD sensors is on the order of starlight illumination (e.g., 1 millilux), which may be too low to meet standards for some night-vision equipment. A need exists for an improvement in CMOS and CCD image sensor sensitivity, such as an order of magnitude improvement in sensitivity, for effective use of CMOS and CCD image sensors in some such night-vision equipment. It is contemplated that improvement of the sensitivity of CMOS and CCD sensors might be applied to digital still or video cameras.

SUMMARY

One embodiment of the invention relates to an avalanche photodiode, which may be a reach-through avalanche photodiode. The avalanche photodiode includes silicon crystal doped with impurities, where the doping profile of the silicon crystal includes a smoothly arcing donor-acceptor concentration curve decreasing with respect to distance into the interior of the silicon crystal that is interrupted by a narrower peak of increased concentration in the interior of the silicon crystal prior to further decreasing with respect to distance along the smoothly arcing donor-acceptor concentration curve. The reach-through avalanche photodiode embeds the p-n junction of the avalanche photodiode within the interior of the device, such that photon-to-electron conversion occurs outside the p-n junction, and electrons are directed toward the p-n junction to be multiplied by the avalanche gain mechanism.

Another embodiment of the invention relates to a method of manufacturing an avalanche photodiode having a low ionization ratio. The method includes diffusing impurities into silicon crystal using a heat source to provide a doping profile of the silicon crystal comprising a smoothly arcing donor-acceptor concentration curve decreasing with respect to distance into the interior of the silicon crystal. The method further includes ion-implanting impurities into the silicon crystal to provide a narrower peak of increased concentration that interrupts, in the interior of the silicon crystal, the smoothly arcing donor-acceptor concentration curve of the doping profile.

Yet another embodiment of the invention relates to an imaging sensor. The imaging sensor includes a pixel, which includes an avalanche photodiode. The avalanche photodiode includes silicon crystal doped with impurities, where the silicon crystal includes a $p^+$ layer of silicon doped with a very high concentration of p-type impurities, a $\pi$ layer of undoped silicon, a p layer of silicon doped with a moderate concentration of p-type impurities, and an $n^+$ layer of silicon doped with a very high concentration of n-type impurities. The $\pi$ layer is positioned between the $p^+$ layer and the p layer, and the p layer is positioned between $\pi$ layer and the $n^+$ layer. The ionization ratio of the avalanche photodiode is 0.02 or less, the thickness of the silicon crystal is 20 microns or less, and the p layer becomes fully depleted at 50 V or less.

Another embodiment of the invention relates to an image sensor, which includes a plurality of pixels responsive to light and readout electronic circuits operatively coupled to the plurality of pixels. The plurality of pixels include avalanche photodiodes including silicon crystal doped with impurities. The avalanche photodiodes have a doping profile that includes a smoothly arcing donor-acceptor concentration curve that decreases with respect to distance into the interior of the silicon crystal. The smoothly arcing donor-acceptor concentration curve is interrupted by a narrower peak of increased concentration in the interior of the silicon crystal, prior to further smoothly decreasing with respect to distance into the interior of the silicon crystal.

Alternative exemplary embodiments relate to other features and combinations of features as may be generally recited in the claims.

BRIEF DESCRIPTION OF THE FIGURES

The disclosure will become more fully understood from the following detailed description, taken in conjunction with the accompanying figures, in which.

DETAILED DESCRIPTION

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Avalanche photodiodes may be used in devices for light sensing, and utilize the phenomenon of impact ionization to provide signal gain. Carriers are driven by an applied bias voltage toward the avalanche gain region (a heavily doped p-n junction) and are accelerated to very high velocities by the static electrical field associated with this junction. The high velocity carriers collide with atoms within the crystalline structure of the semiconductor material, which releases additional carriers to multiply the electric current. In general, avalanche photodiodes are particularly configured to "avalanche" at low breakdown voltages and to operate with associated reverse current. As such, avalanche photodiodes may be used to provide a signal gain. The ionization ratio, k, is the ratio of the hole impact ionization rate to the electron impact ionization rate. All else being equal, reducing the ionization ratio of an avalanche photodiode improves performance (see generally FIGS. 4-5). Therefore, according to an exemplary embodiment, a gain mechanism to improve the sensitivity of silicon CMOS and CCD image sensors uses avalanche photodiodes, such as avalanche photodiodes in a linear-mode avalanche photodiode structure that have a low ionization ratio.

Figure 1:
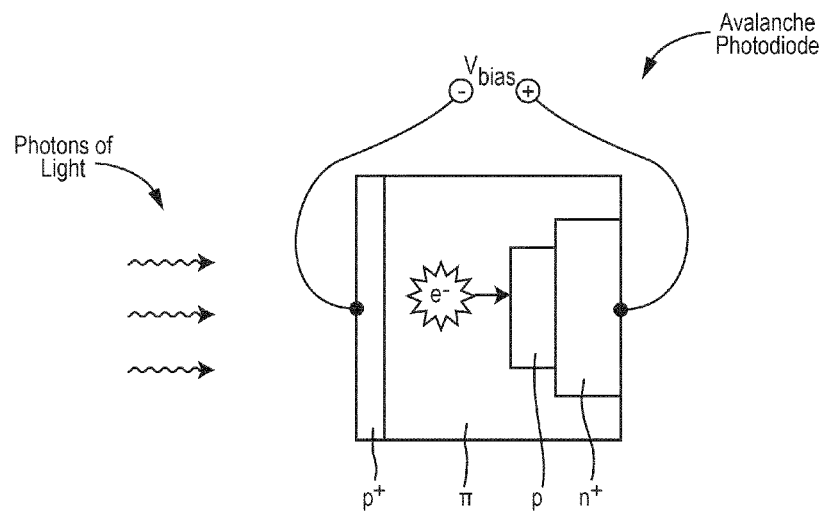
FIG. 1 is a schematic view of an avalanche photodiode according to an exemplary embodiment.

Referring to FIG. 1, an avalanche photodiode is shown according an exemplary embodiment, and includes an unusually low donor (n-type) concentration and a much higher acceptor (p-type) concentration when compared to conventional avalanche photodiodes, which results in very good gain and excess noise performance. Use of low-doping profiles in reach-through avalanche photodiodes for the reduction of the ionization ratio, such as to values less than 0.02 or about 0.015 as taught by the present invention, is believed to improve CMOS and CCD image sensor sensitivity by an order of magnitude or more relative to CMOS and CCD image sensor that do not include such reach-through avalanche photodiodes.

Increased sensitivity of CMOS and CCD image sensors using avalanche photodiodes, as disclosed herein, allows for effective use of the lower-cost image sensors in night-vision equipment. The avalanche photodiodes used with CMOS and CCD image sensors may also be used with digital cameras, heads-up displays, and other devices. For example, it is contemplated that the increased low-light sensitivity provided by avalanche photodiodes used with CMOS and CCD image sensors may allow cameras to operate in low-light conditions without a flash.

According to an exemplary embodiment, the avalanche photodiode includes a $p^+$ layer, an $n^+$ layer, a $\pi$ layer between the $p^+$ layer and a p layer, where the p layer is between the $\pi$ layer and $n^+$ layer (i.e., a $p^+$-$\pi$-p-$n^+$ structure), as shown in FIG. 1. According to an exemplary embodiment, the net thicknesses of the layers of the $p^+$-$\pi$-p-$n^+$ structure is on the order of microns, such as 50 µm or less, 20 µm or less, or even 10 µm or less. It is Applicants' understanding that such a thickness is significantly less than other avalanche photodiodes with ionization ratios on the order of 0.02 or less. The ability to reduce the thickness is largely attributed to the unique doping profile of the avalanche photodiodes disclosed herein (see generally FIG. 2). The reduced thickness allows for avalanche photodiodes disclosed herein to be manufactured using conventional high-speed and low-cost semiconductor fabrication processes. However in other embodiments, avalanche photodiodes disclosed herein are thicker than 50 µm and/or are manufactured by unconventional processes.

The time for the holes to travel to the p+ layer varies as a function of the thickness of the $\pi$ layer and may range from on the order of nanoseconds to on the order of hundreds of microseconds for $\pi$ layers ranging from 20 to 150 microns. As such, the response time of avalanche photodiodes disclosed herein is improved relative to thicker diodes.

During use, light first passes through the $p^+$ layer. If the light has a short wavelength, the light is absorbed in or near the $p^+$ layer. If the light has a longer wavelength, the light is absorbed deeper in the $\pi$ layer. In the $\pi$ layer, electron-hole pairs are generated by the light and are separated from one another by an electric field, which may have a strength on the order of 2 to $3 \times 10^4$ V/cm. The electrons are directed to the p layer. The electric field between the p layer and the $n^+$ layer is great enough to cause an electron "avalanche" (i.e., multiplication) via impact ionization.

In some embodiments, the p layer becomes fully depleted at 50 V or less, at 30 V or less, or even at 20 V or less. Holes correspondingly generated in the process are directed from the p layer, across the $\pi$ layer, and to the $p^+$ layer. According to an exemplary embodiment, the 50 V or less required to establish the electric field and deplete the p layer is substantially less than that of other photodiodes, which may be between about 200 to 300 V. In other embodiments, a voltage of greater than 50 V may be used. In some embodiments, a voltage of at least 10 V is used, where less than 10 V may result in unwanted effects (i.e., results becoming un-physical).

During actual use of the avalanche photodiode, the voltage may be raised such that the p layer and the $\pi$ layer are depleted. For example, at low voltages the p layer is not depleted and the $\pi$ layer has no electric field. However at increasingly greater voltages, the p layer becomes depleted and the depletion zone of the junction increases and extends through the p+ layer. In some embodiments, the voltage of 50 V or less is the voltage required to extend the depletion zone through the p+ layer, but less than the breakdown voltage of the diode.

Additional disclosure is provided in "Recent Developments in Silicon Avalanche Photodiodes," by R. J. McIntyre, published in Measurement volume 3 (1985) on pages 146-152, and "The Distribution of Gains in Uniformly Multiplying Avalanche Photodiodes: Theory," also by R. J. McIntyre, published in IEEE Transactions on Electron Devices, volume 19 (1972) on pages 703-713. Both of these articles by R. J. McIntyre are incorporated by reference herein in their entireties.

In some embodiments, the avalanche photodiode of FIG. 1 includes the sample materials as described in the above articles by R. J. McIntyre, but with doping profiles that differ. While the doping profiles of the present avalanche photodiode may appear similar in shape to the doping profiles described in the above articles by R. J. McIntyre, the doping profiles of the present avalanche photodiode are different in the detailed shape features (e.g., including embedded spike, hump, peak) and substantially different in the doping levels used to achieve the low-k performance of the present avalanche photodiode. The relatively low doping-levels of the present avalanche photodiode and their respective distributions resulted in unexpectedly low ionization ratios when initially discovered by the Applicants, and have been found to have particularly beneficial performance, allowing for a greatly reduced thickness of the photodiode and lower voltage for a corresponding ionization ratio, among other benefits. Modifying the doping profiles to those as disclosed herein and achieving the correspondingly low ionization ratios was thought by the Applicants to be counterintuitive and surprising.

Figure 2:
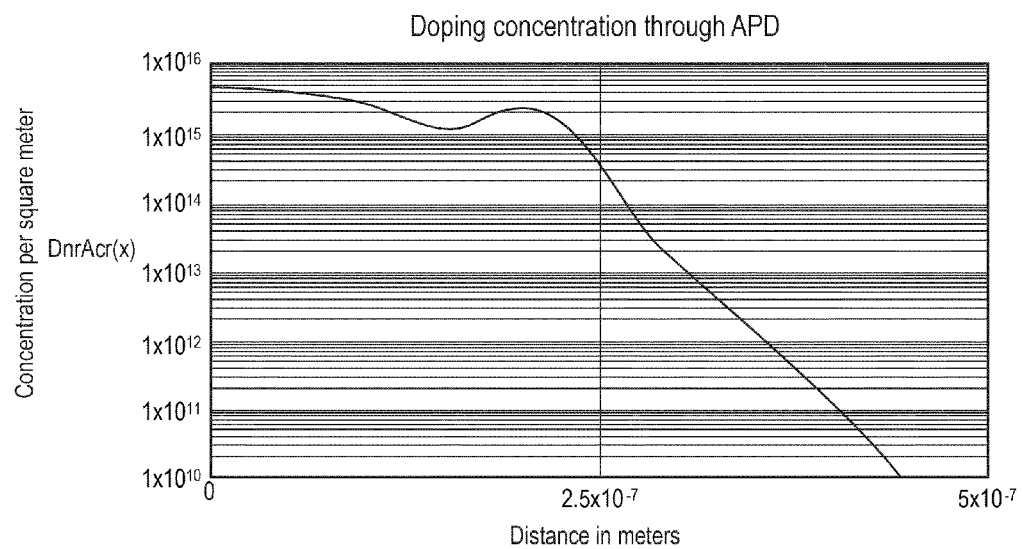
FIG. 2 is a typical plot-shape of a hypothetical donor-acceptor doping profile according to an exemplary embodiment.

Referring now to FIG. 2, a donor-acceptor concentration curve provides the magnitude of the doping in units of concentration per square meter as a function of distance into the interior of the silicon crystal (e.g., p-n junction) through the avalanche photodiode. The thickness of the doped silicon crystal in FIG. 2 is less than a micron, such as about half a micron. The concentration curve is produced at least in part from the theoretical model provided in the above articles by R. J. McIntyre.

Figure 3:
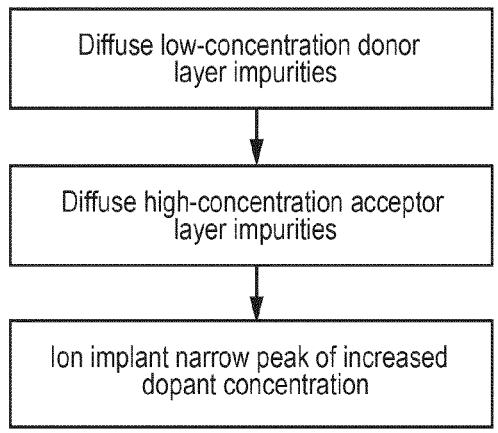
FIG. 3 is a flow diagram of a process of manufacturing an avalanche photodiode according to an exemplary embodiment.

According to an exemplary embodiment, the doping profile of the silicon crystal includes a broad-curve background of dopant in the form of a smoothly arcing donor-acceptor concentration curve. The broad-curve background decreases with respect to distance into the interior of the silicon crystal. Referring to FIG. 3, the broad-curve background portion is produced by diffusion processes, such as diffusing a low level of donor impurities in a diffusion oven, followed by diffusing a high level of acceptor impurities, and then ion implanting a narrow band (e.g., peak, hump) of increased dopant concentration in the interior of the p-n junction of silicon crystal. In other embodiments, the donor impurities may be diffused prior to the acceptor impurities. The dopant may be deposited on the silicon substrate in a variety of ways prior to diffusion, including ion implantation. In some contemplated embodiments, the process may include diffusing a high concentration of donor impurities and a much lower concentration of acceptor impurities (e.g., roughly 2 to 3 orders of magnitude less; with the peak/valley of FIG. 2 flipped). Such a diode may be useful for signal jamming and filter testing.

According to an exemplary embodiment, the broad-curve background of the doping profile is interrupted by a narrower peak (e.g., spike, bump; preceded by a valley) corresponding to an increased concentration of dopant in the interior of the silicon crystal. The narrower peak is significantly narrower than the broad-curve background portion, such as less than a third the thickness. According to an exemplary embodiment, the narrower peak is produced by ion implantation, as shown in FIG. 3. Applicants believe that the combined doping profile is unique and results in the low-k value for the relatively thin, low-voltage avalanche photodiode. Following the peak, the concentration curve further decreases with respect to distance along the smoothly arcing broad-curve background.

Referring again to FIG. 2, the doping profile includes a donor-acceptor concentration between $10^{15}$ and $10^{16}$ per square meter at the surface of the silicon crystal (e.g., outside edge of $n^+$ layer, p-n junction region), and decreases to a donor-acceptor concentration of less than $10^{10}$ per square meter at a distance of less than $5\times10^{-7}$ meters into the interior of the silicon crystal. In some such embodiments, the narrower peak of increased concentration is positioned between $1\times10^{-7}$ and $3\times10^{-7}$ meters into the interior of the silicon crystal. In other embodiments, the shape of the profile is similar, but the concentrations are increased or decreased. In still other embodiments, multiple peaks of increased dopant concentration are used.

Of the impurities used to dope the silicon, in some embodiments the donor concentration is dramatically lower than the acceptor concentration, such as less than ten percent, less than one percent, negligible, etc. For example, in one embodiment the donor concentration is on the order of $10^{13}$ or $10^{14}$ per square meter relative to an acceptor concentration on the order of $10^{15}$ or $10^{16}$. Applicants found k (e.g., about 0.015) to be fairly insensitive to variations in donor concentration over half an order-of-magnitude (e.g., between $2\times10^{13}$ to $9\times10^{13}$) for the bias-voltage resulting in 100-electron gain in 15-μm thick silicon doped with arsenic and boron. Applicants believe that the resulting structure produces fewer holes, resulting in decreased excess noise and an improvement in the signal-to-noise ratio. Boron, arsenic, and other materials may be used as dopants. In some embodiments, a combination of different dopants may be used.

According to an exemplary embodiment, the avalanche photodiode of FIG. 1 is capable of being operated at room-temperature with a low ionization holes/electrons rate-ratio, such as 0.04 or less, or 0.02 or less, for photon-counting or light detection, where a signal threshold detector is employed to sense a signal resulting from the incidence of a single photon (e.g., photon-counting detector), and the threshold-conditions are various voltages corresponding to a predetermined number of electrons in the immediate post-detection signal-processing circuitry.

Figure 4:
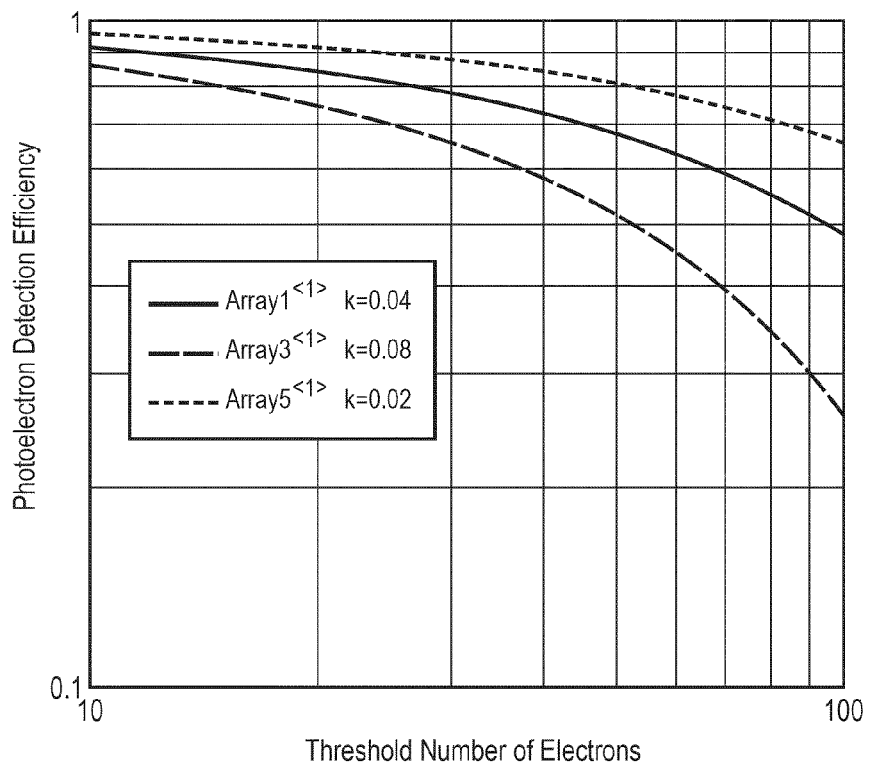
FIG. 4 is a performance diagram of avalanche photodiodes according to exemplary embodiments.
Figure 5:
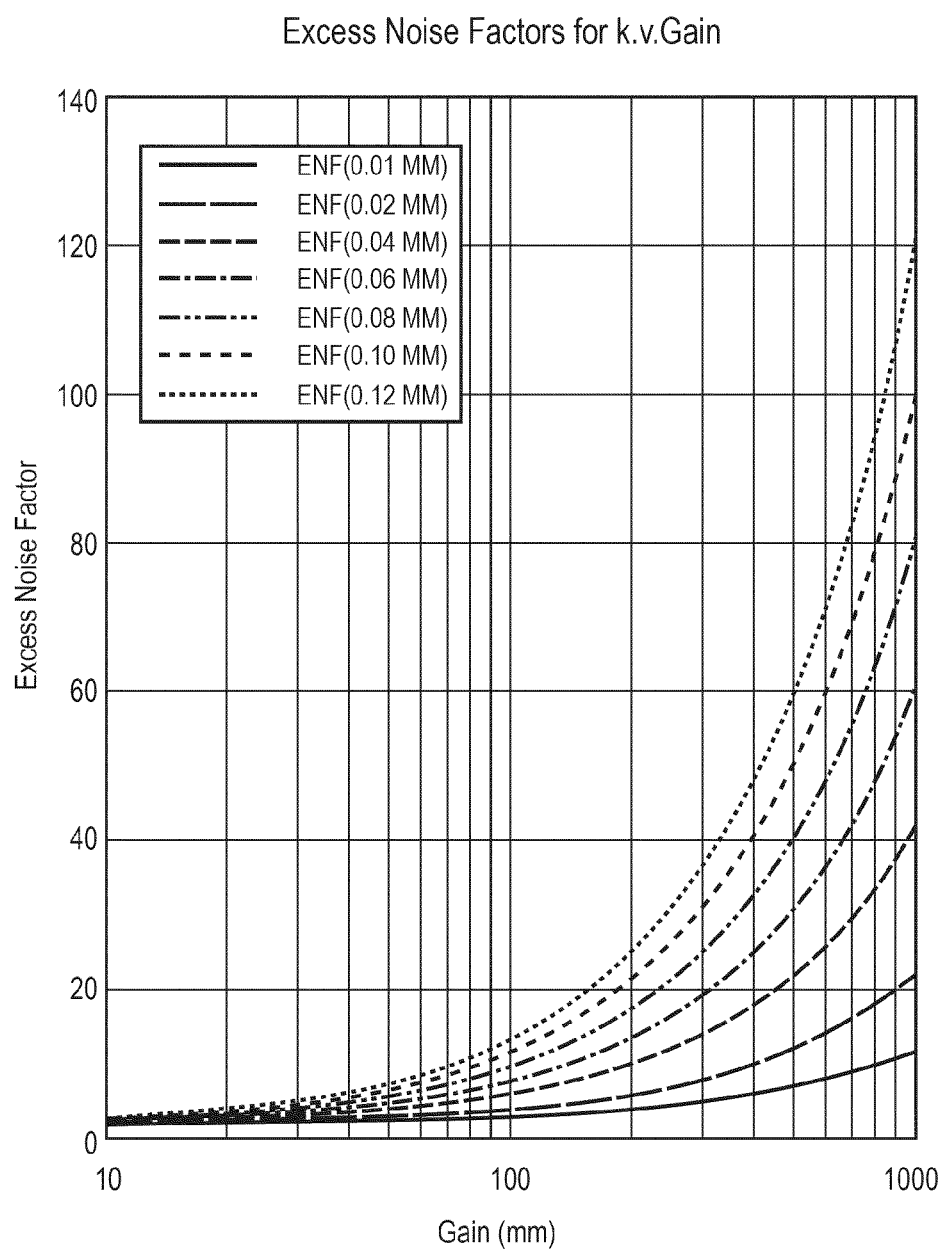
FIG. 5 is another performance diagram of avalanche photodiodes according to exemplary embodiments.

Referring to FIG. 4, photo-electron detection probability curves, based on the theoretical model provided in the above articles by R. J. McIntyre, show a significant benefit in detection efficiency associated with decreased ionization ratio. With an avalanche photodiode having an ionization ratio of 0.02, the post-detection signal-processing circuitry having a 100-electron threshold would have greater than 65-percent single-photo-detections at room temperature. By contrast, an avalanche photodiode of similar structure and voltage but with an ionization ratio of 0.08 would require post-detection signal-processing circuitry having a 30-electron threshold to achieve the same detection probability. Alternately, an avalanche photodiode having an ionization ratio of 0.02 with a 30-electron threshold would have nearly 90-percent single-photo-detection probability at room temperature. FIG. 5 shows theoretical excess noise factors for various ionization ratios as a function of gain, where the lower k value corresponds to reduced excess noise.

In some embodiments, an avalanche photodiode is constructed having two p-type dopants, and may be manufactured in a process similar to manufacture of conventional CMOS detector, which is a standard fabrication process and is highly reliable, well understood, and highly repeatable. The double p-dopant curves took the following form:

| | |
|---|---|
| $dt_1 = -2.82 \times 10^{21}$ | $dt_2 = -1.60 \times 10^{21}$ |
| $do_1 = 0.132 \times 10^{-6}$ | $do_2 = 0$ |
| $dz_1 = 2.47 \times 10^{-6}$ | $dz_2 = 1 \times 10^{-8}$ |
| $dm_1 = 1.95$ | $dm_2 = 0.335$ | with donor concentration here $\sim 2.4\times10^{24}$ cm$^{-3}$:

$$c(z) := dt_1 \cdot \exp\left[-\left(\frac{|z - do_1|}{dz_1}\right)^{dm_1}\right] - dt_2 \cdot \exp\left[-\left(\frac{|z - do_2|}{dz_2}\right)^{dm_2}\right],$$

where the theoretical model is further explained in the in the above articles by R. J. McIntyre (the symbol ":=" means "becomes" or "becomes equal to").

Applicants have fabricated a prototype avalanche photodiode according to the disclosure provided herein. In laboratory testing, Applicants measured a gain value of 8 with excess noise of 1.5. As such, the prototype provided a signal-to-noise ratio improvement of 5.33 (or 7.25 dB) over a typical photodiode light sensor. Applicants believe that an image sensor having the 5.33 signal-to-noise ratio improvement of sensitivity can meet or exceed the some night-vision sensitivity requirements not currently met with economically-sized pixels (e.g., CMOS and CCD image sensors), especially when coupled with best practices, known in industry, for low-light image sensors, such as low-noise readout circuits and back illumination.

In some embodiments, avalanche photodiodes may be substituted for conventional photodiodes (i.e., not avalanche photodiodes) used in the pixels of current, state-of-the-art CCD and CMOS imaging sensors. The modified CCD and CMOS imaging sensors would generally include the other structural components associated with current, state-of-the-art CCD and CMOS imaging sensors, with only slight modifications. For example, modifications may be include connecting the $n^+$ and $p^+$ layers of an avalanche photodiode of FIG. 1 with a bias voltage oriented as shown in FIG. 1. Also, the modified pixel may also include back-side illumination, allowing for favorable light gathering efficiency. In other embodiments, front-side illumination may also be used.

Because avalanche photodiodes may be less consistent in responsiveness (e.g., magnitude of amplification) when compared to conventional photodiodes, an image processor may be used to perform a non-uniformity correction for differences in the responsiveness of different pixels. Applicants believe that the pattern of non-uniformity would repeat for a given pixel without regard to noise. As such, the image processor and non-uniformity correction may be calibrated to the profile of a particular imaging sensor.

The construction and arrangements of the avalanche photodiode, as shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. An avalanche photodiode, comprising:
silicon crystal doped with impurities,
wherein the doping profile of the silicon crystal comprises a smoothly arcing donor-acceptor concentration curve decreasing with respect to distance into the interior of the silicon crystal that is interrupted by a narrower peak of increased concentration in the interior of the silicon crystal prior to further decreasing with respect to distance along the smoothly arcing donor-acceptor concentration curve,
wherein the doping profile is between $10^{15}$ and $10^{16}$ donor-acceptor concentration per square meter at the surface of the silicon crystal and decreases to less than $10^{10}$ donor-acceptor concentration per square meter at a distance of less than $5 \times 10^{-7}$ meters into the interior of the silicon crystal, wherein the ionization ratio of the avalanche photodiode is 0.02 or less.

2. The avalanche photodiode of claim 1, wherein the narrower peak of increased concentration is positioned between $1 \times 10^{-7}$ and $3 \times 10^{-7}$ meters into the interior of the silicon crystal.

3. The avalanche photodiode of claim 1, wherein the thickness of the silicon crystal is 20 microns or less.

4. The avalanche photodiode of claim 3, wherein the silicon crystal has a structure comprising a p+ layer adjacent to a π layer adjacent to a p layer adjacent to an n+ layer, wherein the p layer becomes fully depleted at 50 V or less.

5. The avalanche photodiode of claim 4, wherein p layer becomes fully depleted at 30 V or less.

* * * * *